US005866974A

United States Patent [19]

Herrmann et al.

[11] Patent Number: 5,866,974

[45] Date of Patent: Feb. 2, 1999

[54] ELECTRON BEAM GENERATOR WITH MAGNETIC CATHODE-PROTECTION UNIT

[75] Inventors: Karl Heinz Herrmann, Wankheim; Roland Herb, Dusslingen; Wilfried Hermann Nisch, Tübingen; Gerald Johannes Sermund, Kiel, all of Germany

[73] Assignee: Linotype-Hell AG, Kiel, Germany

[21] Appl. No.: 793,358

[22] PCT Filed: Aug. 23, 1995

[86] PCT No.: PCT/DE95/01113

§ 371 Date: May 6, 1997

§ 102(e) Date: May 6, 1997

[87] PCT Pub. No.: WO96/07195

PCT Pub. Date: Mar. 7, 1996

[30] Foreign Application Priority Data

Aug. 27, 1994 [DE] Germany .......................... 44 30 534.6

[51] Int. Cl.[6] ................................ H01J 1/50; H01J 23/10

[52] U.S. Cl. ....................... 313/308; 313/361.1; 313/158; 219/121.27; 219/121.19

[58] Field of Search ................................ 313/308, 361.1, 313/424, 156, 158, 159; 335/210; 219/121.29, 121.27, 121.18, 121.19

[56] References Cited

U.S. PATENT DOCUMENTS

| | | | |
|---|---|---|---|
| 3,406,273 | 10/1968 | Holland | 313/426 |
| 3,467,057 | 9/1969 | Tamura et al. | 219/121.29 |
| 3,845,346 | 10/1974 | Gerlach | 313/424 |
| 3,949,187 | 4/1976 | Wulff | 219/121.27 |
| 3,976,613 | 8/1976 | Wulff et al. | 219/121.29 |
| 4,155,028 | 5/1979 | Stolte | 313/424 |
| 5,091,655 | 2/1992 | Dykstra et al. | 313/361.1 |

FOREIGN PATENT DOCUMENTS

| | | | |
|---|---|---|---|
| 40 32 918 | 4/1992 | Germany | H01J 37/09 |
| 2 052 845 | 5/1979 | United Kingdom | H01J 29/84 |

*Primary Examiner*—Sandra O'Shea
*Assistant Examiner*—Michael Day
*Attorney, Agent, or Firm*—Hill & Simpson

[57] ABSTRACT

An electron beam generator includes: an electron emitting cathode (1); an anode (3) with an anode bore (4) for the passage of an electron beam (6); a Wehnelt electrode (2) between the cathode (1) and the anode (3) for controlling the electron beam; the cathode (1); the anode (3) and the Wehnelt electrode (2) disposed within a vacuum chamber (100); and a magnetic unit (7) disposed between the cathode (1) and the anode (3) for generating a static transverse magnetic field causing the electrons to be deflected along a curved path until the electrons enter the anode (3) such that ions follow an ionic path back to strike the Wehnelt electrode (2) and are kept from striking the cathode (1) by displacement caused by the ionic path. The present invention reduces the number of ions that impact the cathode and reduces the number of ions that are formed by the ionization of residual molecules, increasing the service life of the cathode.

8 Claims, 3 Drawing Sheets

ELECTRON BEAM GENERATOR WITH MAGNETIC CATHODE-PROTECTION UNIT

BACKGROUND OF THE INVENTION

Field of the Invention

The invention is directed to an electron beam generator composed of an electron-emitting cathode, of an anode with an anode bore for the passage of the electron beam along a beam axis, and of a Wehnelt electrode for controlling the electron beam. The cathode, the anode and Wehnelt electrode are arranged in a vacuum chamber.

An electron beam generator is utilized in electron beam devices for processing material, for example in electron beam engraving devices for engraving printing forms for rotogravure in reproduction technology or for engraving surface structures on textured drums with which thin sheets are processed in rolling mills for improving quality.

An electron beam engraving unit for printing forms or textured drums is disclosed, for example, by DE-A40 32 918. The electron beam engraving the is essentially composed of a first vacuum chamber in which an electron beam generator and an electron-optical control system for the electron beam are accommodated, and of a second vacuum chamber in which the printing form or the textured drum to be engraved with the electron beam is located. The electron beam generator is essentially composed of a cathode, of an anode with an anode bore and of a Wehnelt electrode. The electrons that produce the electron beam are emitted by the heated cathode, which lies at high-voltage potential, and are accelerated in the direction toward the anode that, for example, has zero potential. The electron beam is supplied to the electron-optical control system through the anode bore and then passes through an opening in the first vacuum chamber and enters the second vacuum chamber as a working chamber in order to process the printing form or the textured drum.

Given electron beam devices such as, for example, electron beam engraving units that are operated with high-voltage in the kV range and in a high vacuum, ions that arise due to ionization of residual gas molecules occur in the electron beam generator. These ions are accelerated onto the cathode and destroy the cathode by eroding material. It is particularly ions that derive from the acceleration space and are formed immediately in front of the cathode that participate in the destruction of the cathode.

The destruction of the cathode by the ion bombardment makes frequent maintenance work at the electron beam generator necessary, the destroyed cathode having to be thereby replaced by a new cathode. The maintenance jobs disadvantageously lead to standstill times of the electron beams devices. Over and above this, the active emission area is reduced in size due to the erosion of material from the cathode caused by the ion bombardment, and the characteristic current density profile of the electron beam is modified in a disadvantageous way.

SUMMARY OF THE INVENTION

It is therefore an object of the present invention to improve an electron beam generator such that the service life of the cathode is lengthened and nearly maintenance-free operation is thereby enabled.

According to the invention, an electron beam generator is provided having an electron-emitting cathode, an anode with an anode bore for passage of an electron beam formed of electrons emitted by the cathode, and a Wehnelt electrode arranged between the cathode and the anode for controlling the electron beam. The cathode, the anode, and the Wehnelt electrode are arranged in a vacuum chamber. The cathode together with the Wehnelt electrode are laterally displaced relative to the anode. A magnetic cathode protector unit is arranged between the cathode and the anode for generating a static transverse magnetic field in a region of the electron beam proceeding from the cathode to the anode. The magnetic cathode protector unit transverse magnetic field causes a lateral deflection of the electron beam corresponding to the lateral displacement of the cathode and Wehnelt electrode relative to the anode so that the electron beam follows a curved path as it leaves the cathode, passes through the Wehnelt electrode, and enters the anode bore of the anode. Ions formed by ionization of residual gas molecules are separated from the electron beam and fly on ion paths straight ahead towards the Wehnelt electrode where they impact because of the curved electron beam path and displacement of the cathode and Wehnelt electrode relative to the anode, and are thus kept substantially away from bombarding the cathode.

The invention is shown in greater detail below with reference to FIGS. 1 through 3.

DESCRIPTION OF THE PREFERRED EMBODIMENTS

Figure 1:
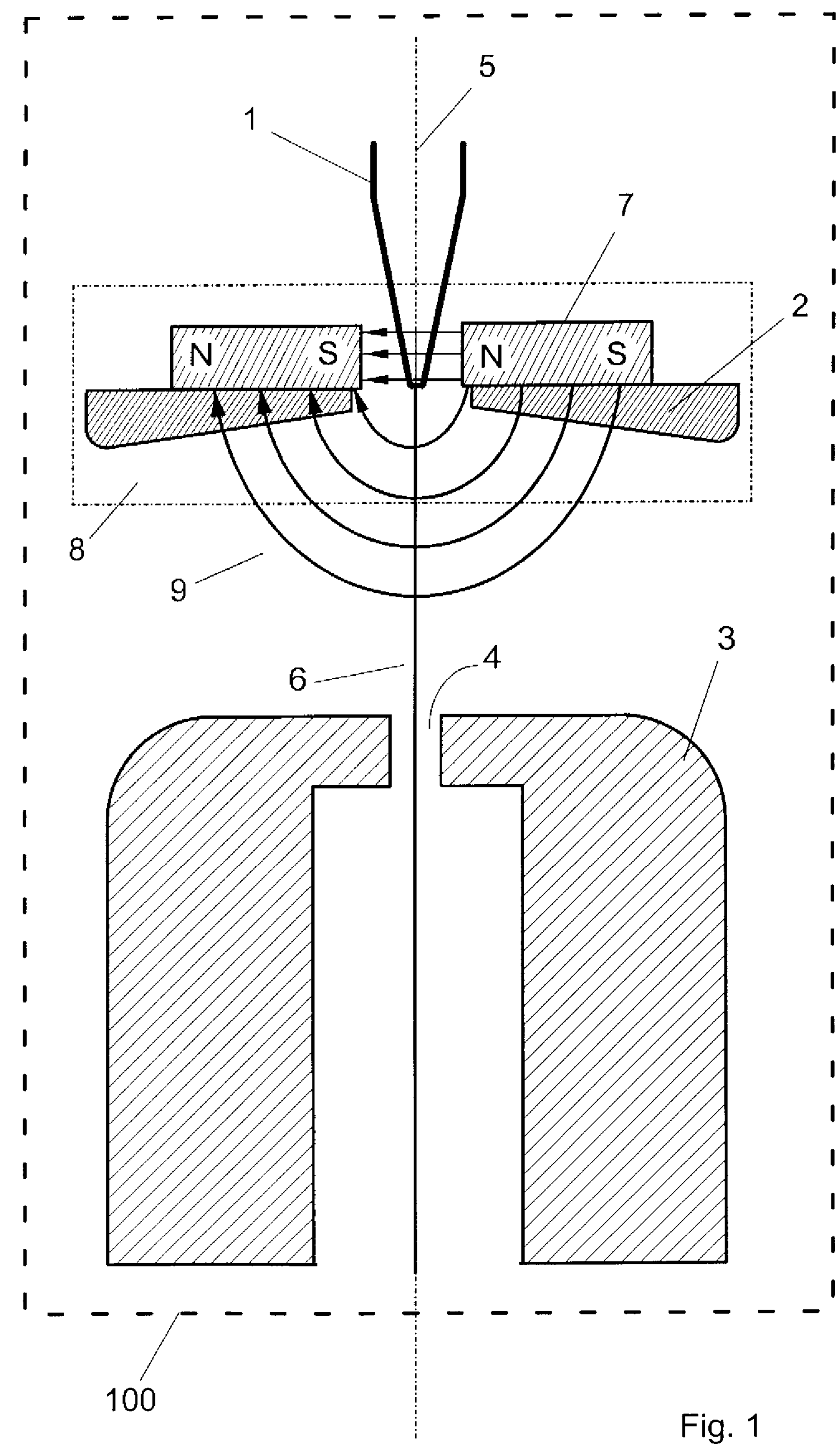
FIG. 1 shows the schematic structure of an electron beam generator, in section.

FIG. 1 shows the schematic structure of an electron beam generator in section in the direction of a beam axis.

The electron beam generator is composed of a cathode 1, of an annular Wehnelt electrode 2 and of an anode 3 with an anode bore 4 that are positioned along a beam axis 5 and arranged in a vacuum chamber 100. For example, a directly or indirectly heated band cathode of tungsten is employed as cathode 1. The cathode 1 lies, for example, at a potential of −35 kV, the Wehnelt electrode 2 at a potential of 35.6 kV, and the anode 3 has zero potential. The electrons that form an electron beam 6 are emitted from the emission surface of the cathode 1, pass through the Wehnelt electrode 2 and are accelerated in the direction of the anode 3. The electrons leave the electron beam generator through the anode bore 4. The Wehnelt electrode serves the purpose of controlling the beam current. At a specific value of a control voltage for the Wehnelt electrode 2, no electrons emit from the cathode 1, i.e. there are no electrical field vectors directed onto the anode 3 that accelerate the electrons in the direction of the anode 3. When the control voltage is lowered, the anode inverse amplification factor is increased and a larger and larger area of the emission surface of the cathode 1 is enabled.

Ions that are accelerated onto the cathode 1 in traditional electron beam generators arise in the electron beam generator due to ionization of residual gas molecules. The erosion of material caused by the ion bombardment reduces the size of the active emission surface of the cathode 1, and the characteristics beam density profile of the electron beam 6 is disadvantageously modified. In particular, it is thereby the ions deriving from the acceleration space between cathode 1 and anode 3 that participate in the destruction of the cathode 1.

The electron beam generator of the invention comprises a magnetic cathode protector device 7 that is referred to below as a magnetic ion separator 7. In the exemplary embodiment shown in FIG. 1, the magnetic ion separator 7 is arranged in the proximity of the cathode 1, is centered relative thereto, and is structurally united with the Wehnelt electrode 2.

Cathode 1, magnetic ion separator 7 and Wehnelt electrode 2 are combined to form a beam generating unit 8 that is seated in the vacuum chamber perpendicular to the beam axis 5 displaceable relative to the anode 3. The design of the displaceable beam generating unit 8 is undertaken such that an exact positioning with an adjustment unit located outside the vacuum chamber is also possible during operation.

The magnetic ion separator 7 generates a static, transverse magnetic field 9 that essentially proceeds perpendicular to the beam axis 5 or, respectively, perpendicular to direction in which the electrons move, a few magnetic field lines thereof being indicated in FIG. 1. The transverse magnetic field 9 takes effect in the region of the electron beam 6 between cathode 1 and anode 3, preferably in the cathode plane. The magnetic field strength of the transverse magnetic field 9 decreases in the direction toward the anode 2. The magnetic field strength preferably has a maximum value in the proximity of the cathode 1, then a pronounced drop in the direction toward the anode 3 and a low, nearly constant value in the region of the anode 3.

Due to the Lorenz force, the transverse magnetic field 9 generated in the magnetic ion separator 7 deflects the electrons out of the beam axis 5 perpendicular to the transverse magnetic field 9, i.e. perpendicular to the plane of the drawing. By contrast thereto, the ions are only slightly influenced by the transverse magnetic field 9 because of their mass and follow the electrical field, as a result whereof a separation of the ions from the electrons of the electron beam 6 is achieved. The deflection of the electrons effects a curvature of the electron beam 6 on the way to the anode 3, this being shown in FIG. 2.

Figure 2:
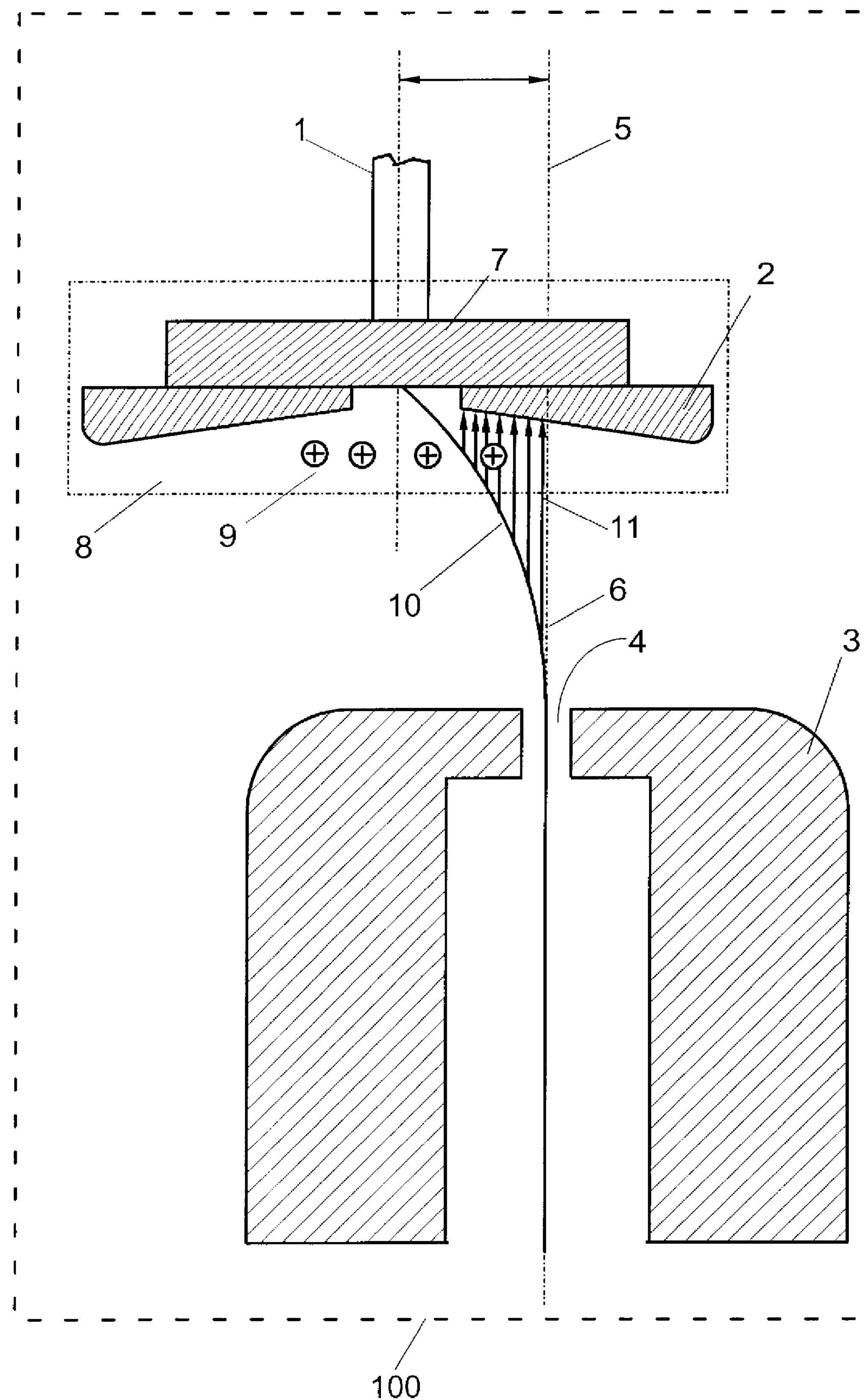
FIG. 2 illustrates the electron beam generator in a section rotated by 90° around a beam axis.

FIG. 2 shows the electron beam generator in a section that is rotated by 90° around the beam axis 5 compared to the illustration of FIG. 1. The curved path 10 of the electron beam 6 between cathode 1 and anode 3 due to the deflection of the electron beam 6 by the transverse magnetic field 9 of the magnetic ion separator 7 is also shown.

The beam generating unit 8 formed of cathode 1, magnetic ion separator 7 and Wehnelt electrode 2 is arranged perpendicular to the beam axis 5 shifted out of the beam axis 5 opposite the deflection direction of the electron beam 6, as a result whereof the beam axis 5 no longer proceeds through the opening of the Wehnelt electrode 2 and through the cathode 1, but instead proceeds through the electrode surface of the Wehnelt electrode 2.

The dislocation of the beam generating unit 8 relative to the anode 3 and/or the field strength of the transverse magnetic field 9 is thereby selected such that the curved electron beam 6 again enters into the beam axis 5 in the region of the anode 3 and then proceeds in the beam axis 5 itself within the anode bore 4.

What is advantageously achieved by these techniques of the invention is that a majority of the ions—due to their greater mass—do not follow the curved path 10 of the electron beam 6 and undesirably impact the cathode 1 but instead fly on ion paths 11 straight ahead in the direction of the beam axis 5 and thereby impact the Wehnelt electrode 2 because of the displacement of the beam generating unit 8. What is thus advantageously achieved due to the abated ion bombardment of the cathode 1 is that the operating time or service life, i.e. the usable time of the cathode 1, is decisively lengthened. Over and above this, a more uniform erosion of material from the emission surface of the cathode 1 and, thus, an improved beam current profile of the electron beam 6 are achieved.

Figure 3:
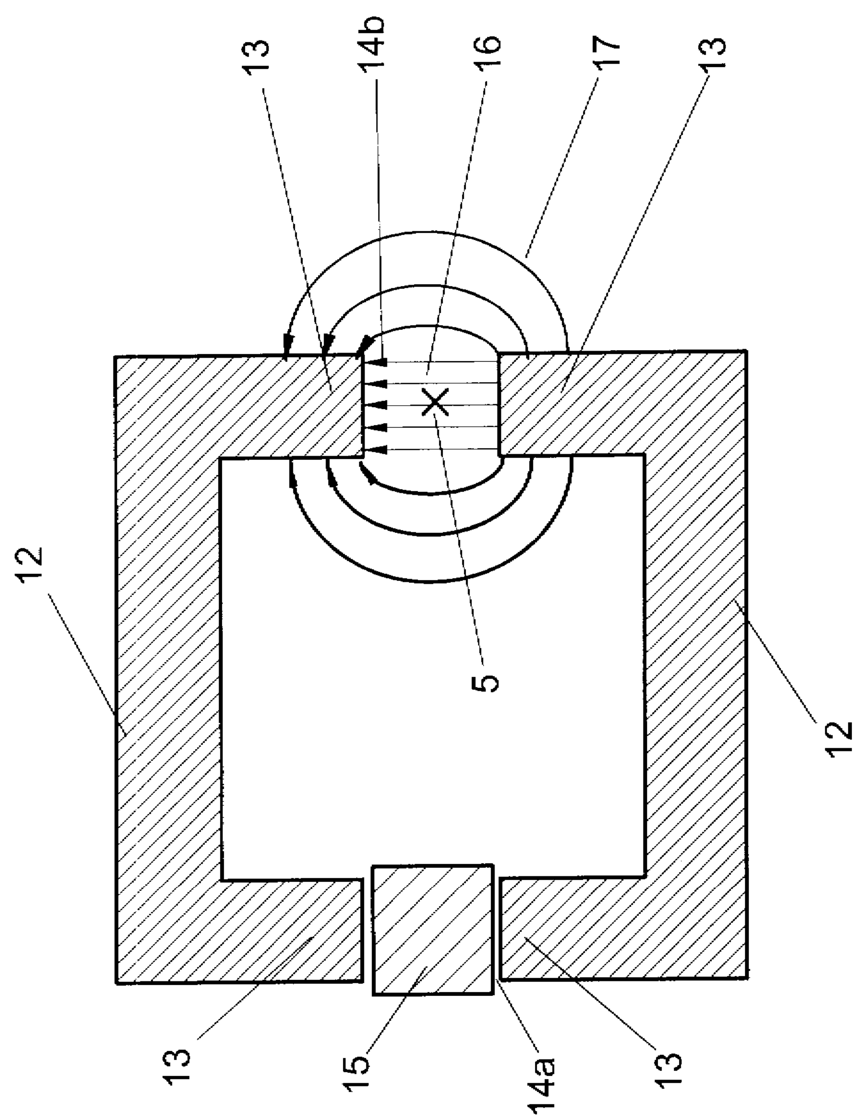
FIG. 3 is an exemplary embodiment of a magnetic ion separator.

FIG. 3 shows an exemplary embodiment of the magnetic ion separator 7 in a section perpendicular to the beam axis.

The magnetic ion separator 7 is composed, for example, of two U-shaped pole shoes 12 whose legs 13 lie opposite one another and are distanced from one another, so that gaps 14*a*, 14*b* are formed. A permanent magnet 15 is located in the one air gap 14*a*, and which generates a nearly uniform magnetic field 16 in the other air gap 14*b* with a magnetic stray field 17 that proceeds outside the air gap 14*b*.

The unit formed of the pole shoes 12 and the permanent magnet 15 is arranged perpendicular to the beam axis 5 in the electron beam generator and is aligned such that the beam axis 5 proceeds through the air gap 14*b*. The stray field 17 generates the transverse magnetic field 9 in the cathode plane.

The pole shoes 12 are composed, for example, of soft iron. Since the permanent magnet is exposed to high thermic loads due to its proximity to the highly heated cathode 1, a magnet material must be employed whose magnetic properties have a low reversible dependency on the temperature.

The generation of the transverse magnetic field 9 and the design of the magnetic ion separator are not limited to the described exemplary embodiment.

Although various minor changes and modifications might be proposed by those skilled in the art, it will be understood that our wish is to include within the claims of the patent warranted hereon all such changes and modifications as reasonably come within our contribution to the art.

We claim as our invention:

1. An electron beam generator, comprising:

an electron-emitting cathode, an anode with an anode bore for passage of an electron beam formed of electrons emitted by the cathode, and a Wehnelt electrode arranged between the cathode and the anode for controlling the electron beam;

the cathode, the anode, and the Wehnelt electrode being arranged in a vacuum chamber;

the cathode together with the Wehnelt electrode being laterally displaced relative to the anode; and a magnetic cathode protector unit arranged between the cathode and the anode, said protector unit generating a static transverse magnetic field in a region of a path of the electron beam leaving the cathode, said magnetic field causing the electron beam to be deflected along a curved path as it leaves the cathode until it enters the anode bore of the anode, and the magnetic field displacing the electron beam by an amount equivalent to the displacement of the cathode and Wehnelt electrode relative to the anode so that ions formed by ionization of residual gas molecules in the vacuum chamber follow an ion path straight back towards the Wehnelt electrode and are kept away from striking the cathode by the displacement caused by the curved path.

2. The electron beam generator according to claim 1 wherein the magnetic cathode protector unit is arranged in a region of the cathode and with the Wehnelt electrode being provided between the magnetic cathode protector unit and the anode.

3. The electron beam generator according to claim 1 wherein the magnetic cathode protector unit has pole faces of pole shoes arranged at the Wehnelt electrode and centered relative to where the beam is emitted from the cathode.

4. The electron beam generator according to claim 1 wherein:

the magnetic cathode protector unit comprises two U-shaped pole shoes having legs lying opposite one another and spaced from one another, and as a result of which first and second air gaps are formed;

a permanent magnet arranged in the first air gap, the permanent magnet generating a magnetic field in the second air gap with the stray field outside the air gap; and the magnetic cathode protector unit being arranged such that the electron beam proceeds through the second air gap perpendicular to the magnetic field, and the stray field forms the transverse magnetic field.

5. The electron beam generator according to claim 4 wherein the pole shoes are formed of soft iron.

6. The electron beam generator according to claim 4 wherein the permanent magnetic is formed of a magnet material having magnetic properties which are temperature stable.

7. An electron beam generator, comprising:

an electron emitting cathode, an anode with an anode bore for passage of an electron beam formed of electrons emitted by the cathode, and a Wehnelt electrode arranged between the cathode and the anode for controlling the electron beam;

the cathode, the anode, and the Wehnelt electrode being arranged in a vacuum chamber;

the cathode together with the Wehnelt electrode being laterally displaced relative to the anode; and a magnetic cathode protector unit arranged between the cathode and the anode, said protector unit generating a static transverse magnetic field in a region of a path of the electron beam leaving the cathode, said magnetic field causing the electron beam to be deflected along a curved path as it leaves the cathode until it enters the anode bore of the anode, and the magnetic field displacing the electron beam by an amount equivalent to the displacement of the cathode and Wehnelt electrode relative to the anode so that ions formed by ionization of residual gas molecules in the vacuum chamber are separated from the electron beam and are substantially prevented from striking the cathode by the displacement caused by the curved path; and a field strength of the transverse magnetic field has a maximum value in a region of the cathode and then drops sharply and has a low value in a region of the anode.

8. An electron beam generator, comprising:

an electron-emitting cathode, an anode with an anode bore for passage of an electron beam formed of electrons emitted by the cathode, and a Wehnelt electrode arranged between the cathode and the anode for controlling the electron beam;

the cathode, the anode, and the Wehnelt electrode being arranged in a vacuum chamber;

the cathode together with the Wehnelt electrode being laterally displaced relative to the anode; and a magnetic cathode protector unit arranged between the cathode and the anode, said protector unit generating a static transverse magnetic field in a region of a path of the electron beam leaving the cathode and having a field strength which decreases in a direction toward said anode, said magnetic field causing the electron beam to be deflected along a curved path as it leaves the cathode until it enters the anode bore of the anode, and the magnetic field displacing the electron beam by an amount equivalent to the displacement of the cathode and Wehnelt electrode relative to the anode so that ions formed by ionization of residual gas molecules in the vacuum chamber are separated from the electron beam and are substantially prevented from striking the cathode by the displacement caused by the curved path.

* * * * *